United States Patent
Yang et al.

(10) Patent No.: US 10,622,145 B2
(45) Date of Patent: Apr. 14, 2020

(54) MAGNETIC THIN FILM DEPOSITION CHAMBER AND THIN FILM DEPOSITION APPARATUS

(71) Applicant: BEIJING NAURA MICROELECTRONICS EQUIPMENT CO., LTD., Beijing (CN)

(72) Inventors: Yujie Yang, Beijing (CN); Tongwen Zhang, Beijing (CN); Wei Xia, Beijing (CN); Peijun Ding, Beijing (CN); Hougong Wang, Beijing (CN)

(73) Assignee: BEIJING NAURA MICROELECTRONICS EQUIPMENT CO., LTD., Beijing (CN)

( * ) Notice: Subject to any disclaimer, the term of this patent is extended or adjusted under 35 U.S.C. 154(b) by 0 days.

(21) Appl. No.: 16/386,651

(22) Filed: Apr. 17, 2019

(65) Prior Publication Data
US 2019/0244754 A1 Aug. 8, 2019

Related U.S. Application Data

(63) Continuation of application No. PCT/CN2017/106688, filed on Oct. 18, 2017.

(30) Foreign Application Priority Data

Oct. 31, 2016 (CN) .......................... 2016 1 0929208

(51) Int. Cl.
*H01J 37/34* (2006.01)
*H01F 41/18* (2006.01)
(Continued)

(52) U.S. Cl.
CPC ......... *H01F 41/183* (2013.01); *C23C 14/351* (2013.01); *C23C 14/564* (2013.01);
(Continued)

(58) Field of Classification Search
CPC .. C23C 14/564; C23C 14/351; H01J 37/3452; H01J 37/3435; H01F 41/183;
(Continued)

(56) References Cited

U.S. PATENT DOCUMENTS 6,764,575 B1 * 7/2004 Yamasaki ........... H01J 37/3266
                                                    118/723 E
8,917,485 B2 * 12/2014 Fukuzawa ............. B82Y 25/00
                                                    360/324.1
(Continued)

FOREIGN PATENT DOCUMENTS

CN      1135084 A      11/1996
CN    101047229 A      10/2007
(Continued)

OTHER PUBLICATIONS

The World Intellectual Property Organization (WIPO) International Search Report for PCT/CN2017/106688 dated Jan. 22, 2018 8 Pages.

*Primary Examiner* — Rodney G McDonald
(74) *Attorney, Agent, or Firm* — Anova Law Group, PLLC (57) ABSTRACT

The present disclosure provides a magnetic thin film deposition chamber and a thin film deposition apparatus. The magnetic thin film deposition chamber includes a main chamber and a bias magnetic field device. A base pedestal is disposed in the main chamber for carrying a to-be-processed workpiece. The bias magnetic field device is configured for forming a horizontal magnetic field above the base pedestal, and the horizontal magnetic field is used to provide an
(Continued)

in-plane anisotropy to a magnetized film layer deposited on the to-be-processed workpiece. The thin film deposition chamber provided in present disclosure is capable of forming a horizontal magnetic field above the base pedestal that is sufficient to induce an in-plane anisotropy to the magnetic thin film.

17 Claims, 5 Drawing Sheets

(51) Int. Cl.
*C23C 14/35* (2006.01)
*H01F 7/02* (2006.01)
*C23C 14/56* (2006.01)
*H01F 41/22* (2006.01)
*H01F 41/14* (2006.01)

(52) U.S. Cl.
CPC ............ *H01F 7/02* (2013.01); *H01F 7/0273* (2013.01); *H01F 41/14* (2013.01); *H01F 41/22* (2013.01); *H01J 37/3435* (2013.01); *H01J 37/3452* (2013.01)

(58) Field of Classification Search
CPC .......... H01F 7/02; H01F 7/0273; H01F 41/22; H01F 41/14
USPC ................. 204/298.16; 118/723 E, 723 MA, 118/723 MR
See application file for complete search history.

(56) References Cited

U.S. PATENT DOCUMENTS

| | | | |
|---|---|---|---|
| 2003/0146084 A1* | 8/2003 | Fu | C23C 14/14 204/192.2 |
| 2007/0102286 A1* | 5/2007 | Scheible | C23C 14/3407 204/298.01 |
| 2015/0206657 A1 | 7/2015 | El-Ghazaly et al. | |

FOREIGN PATENT DOCUMENTS

| | | |
|---|---|---|
| CN | 101901868 A | 12/2010 |
| CN | 204732294 U | 10/2015 |
| CN | 105679528 A | 6/2016 |
| CN | 105779952 A | 7/2016 |

\* cited by examiner

MAGNETIC THIN FILM DEPOSITION CHAMBER AND THIN FILM DEPOSITION APPARATUS

CROSS-REFERENCE TO RELATED APPLICATIONS

This application is a continuation of International Application No. PCT/CN2017/106688, filed on Oct. 18, 2017, which claims the priority and benefits of Chinese Patent Application Serial No. CN201610929208.0, filed with the State Intellectual Property Office of P. R. China on Oct. 31, 2016, the entire content of all of which is incorporated herein by reference.

FIELD OF THE INVENTION

The present invention relates to the field of microelectronics and, more particularly, relates to a magnetic thin film deposition chamber and a thin film deposition apparatus.

BACKGROUND

With the development of technology, the integrated circuit manufacturing process has been able to significantly reduce the size of the processor. However, there are still some core components such as integrated inductors, noise suppressors, etc., facing many difficulties in high frequency, miniaturization, integration, etc. In order to solve this problem, soft magnetic thin film materials with high magnetization, high magnetic permeability, high resonance frequency, and high electrical resistivity have attracted more and more attention.

Although the focus on soft magnetic thin film material is mainly on high magnetic permeability and high magnetization, as well as low coercivity and low loss, a major factor that affects the development of soft magnetic thin film material is its cutoff frequency. By adjusting the in-plane uniaxial anisotropy field of the soft magnetic thin film, the cutoff frequency of the soft magnetic thin film material can be adjusted. Moreover, a common method for controlling the in-plane uniaxial anisotropy field of a soft magnetic thin film is magnetic-field-induced deposition, which has the advantages for providing simple process without adding process steps, and less damage to the chip, and is a preferred method for industrial production.

However, the existing magnetic-field-induced deposition methods have not been applied to production apparatuses, such as PVD apparatus, for fabricating magnetic thin films. That is, the existing thin film deposition chamber is not capable of inducing an in-plane anisotropy to the magnetic thin film.

BRIEF SUMMARY OF THE INVENTION

One aspect of the present disclosure provides a magnetic thin film deposition chamber. The magnetic thin film deposition chamber includes a main chamber and a bias magnetic field device. A base pedestal is disposed in the main chamber for carrying a to-be-processed workpiece. The bias magnetic field device is configured for forming a horizontal magnetic field above the base pedestal, and the horizontal magnetic field is used to provide an in-plane anisotropy to a magnetized film layer deposited on the to-be-processed workpiece.

Another aspect of the present disclosure provides a thin film deposition apparatus. The thin film deposition apparatus includes at least one first deposition chamber for depositing magnetized film layers. Each first deposition chamber of the at least one first deposition chamber includes a main chamber and a bias magnetic field device. A base pedestal is disposed in the main chamber for carrying a to-be-processed workpiece. The bias magnetic field device is configured for forming a horizontal magnetic field above the base pedestal, and the horizontal magnetic field is used to provide an in-plane anisotropy to a magnetized film layer deposited on the to-be-processed workpiece.

Other aspects of the present disclosure can be understood by those skilled in the art in light of the description, the claims, and the drawings of the present disclosure.

DETAILED DESCRIPTION

In order to let those skilled in the art to better understand the technical solutions of the present disclosure, the magnetic thin film deposition chamber and the thin film deposition apparatus provided by the present disclosure are described in detail below with reference to the accompanying drawings.

Figure 1:
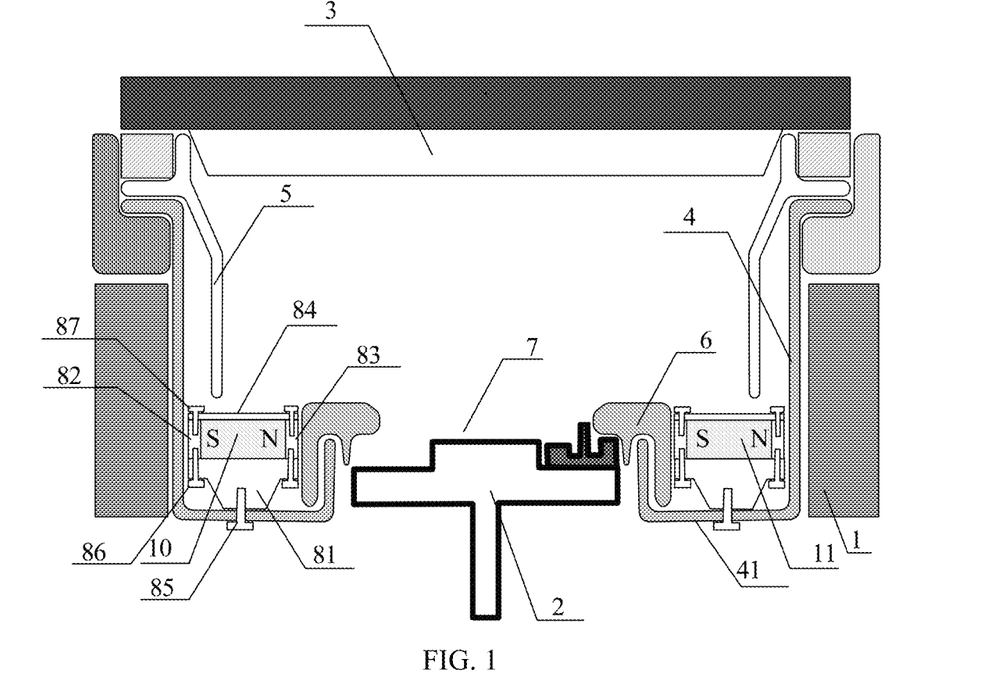
FIG. 1 illustrates a cross-sectional view of a magnetic thin film deposition chamber according to a first embodiment of the present disclosure.
Figure 2A:
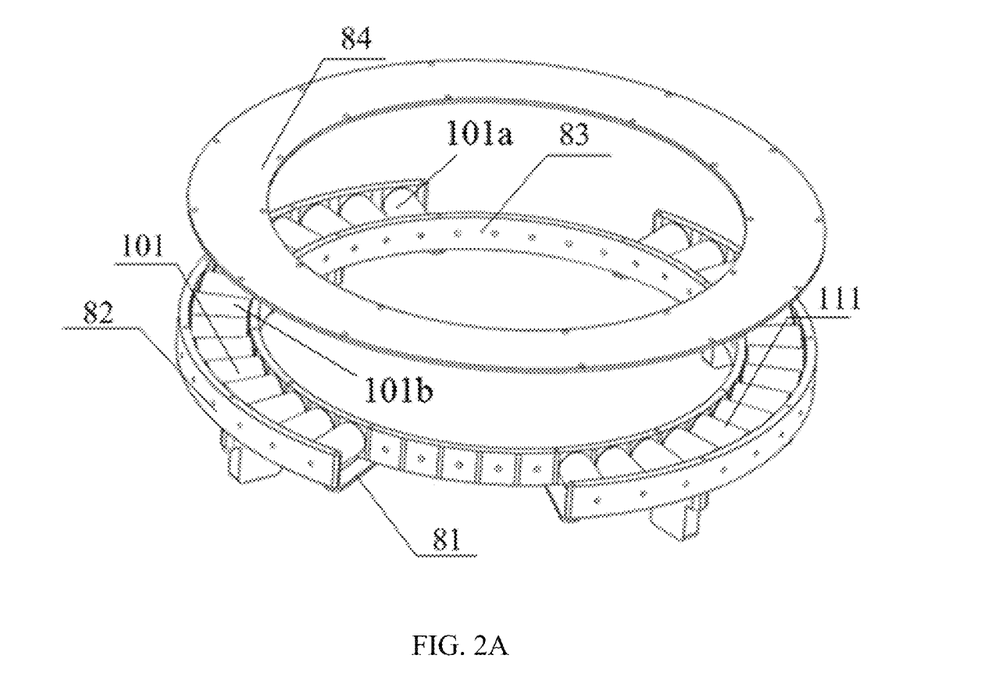
FIG. 2A illustrates an exploded view of the magnet assembly shown in FIG. 1.
Figure 2B:
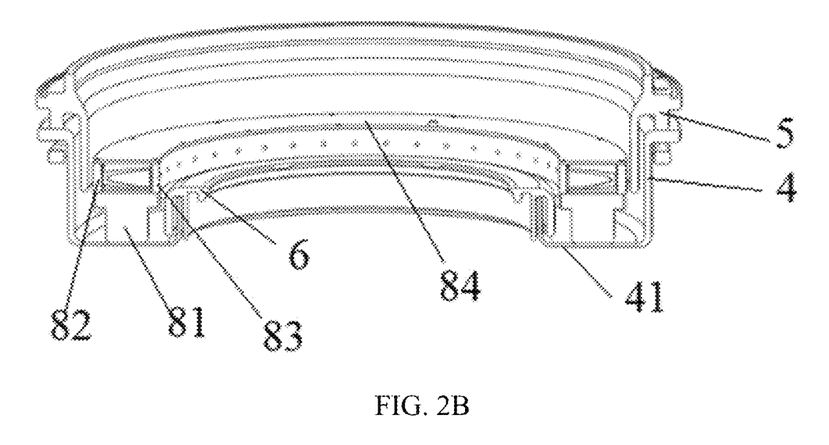
FIG. 2B illustrates a semi-cross-sectional view of the magnet assembly and the shielding assembly shown in FIG. 1.

FIG. 1 illustrates a cross-sectional view of a magnetic thin film deposition chamber according to a first embodiment of the present disclosure. FIG. 2A illustrates an exploded view of the magnet assembly shown in FIG. 1. FIG. 2B illustrates a semi-cross-sectional view of the magnet assembly and the shielding assembly shown in FIG. 1. Referring to FIGS. 1 to 2B together, the magnetic thin film deposition chamber may include a main chamber 1 and a shielding assembly. A target 3 may be disposed at the top portion of the main chamber 1 and inside the main chamber 1. In addition, a base pedestal 2 may be disposed below the target 3 to carry a to-be-processed workpiece 7. The shielding assembly may include an upper shielding ring 5, a lower shielding ring 4, and a pressing ring 6. The lower shielding ring 4 may be disposed around the inner side of the sidewall of the main chamber 1, and a support component 41 may be disposed at the lower end of the lower shielding ring 4 for supporting the pressing ring 6. The support component 41 and the lower shielding ring 4 may be an integrated structure bent from the lower end of the lower shielding ring 4 toward the inner side, and thus form a "hook" shape. The upper shielding ring 5 may be disposed around the inner side of the lower shielding ring 4, such that at least the lower half of the upper shielding ring 5 may cover at least the inner wall of the upper half of the lower shielding ring 4. The upper shielding ring 5 and the lower shielding ring 4 may together shield the sidewall of the main chamber 1 for preventing the sputtered target material deposition on the sidewall of the main chamber 1. The pressing ring 6 may be used to, when the base pedestal 2 is in the process position, press down the edge region of the upper surface of the to-be-processed workpiece 7, such that the to-be-processed workpiece 7 can be fixed on the base pedestal 2. When the base pedestal 2 is in the non-process position, the pressing ring 6 may be in contact with the support component 41 and may be supported by the support component 41; when the base pedestal 2 is in the process position, the pressing ring 6 may be lifted up by the raised base pedestal 2, and may thus be disengaged from the support component 41. As such, with the help of the self-gravity of the pressing ring 6, the to-be-processed workpiece 7 may be fixed on the base pedestal 2. In one embodiment, the non-process position may be located below the process position.

When the process is performed, the lower shielding ring 4, the support component 41, and the pressing ring 6 may cover the area between the base pedestal 2 and the sidewall of the main chamber 1, such that deposition of the sputtered target material on the bottom and the sidewall of the main chamber 1 can be prevented. FIG. 1 only schematically shows a portion of the main chamber 1 above the base pedestal 2, and the bottom structure of the main chamber 1 is not shown.

The thin film deposition chamber may further include a bias magnetic field device for forming a horizontal magnetic field above the base pedestal 2. The horizontal magnetic field may be used to provide in-plane anisotropic characteristics to the magnetized film layer deposited on the to-be-processed workpiece 7, thereby satisfying the needs of production equipment for preparing magnetized film layers with in-plane anisotropies. In one embodiment, the bias magnetic field device includes a magnet assembly disposed around the base pedestal 2, and the magnet assembly may be configured for forming the horizontal magnetic field above the base pedestal 2.

Figure 2C:
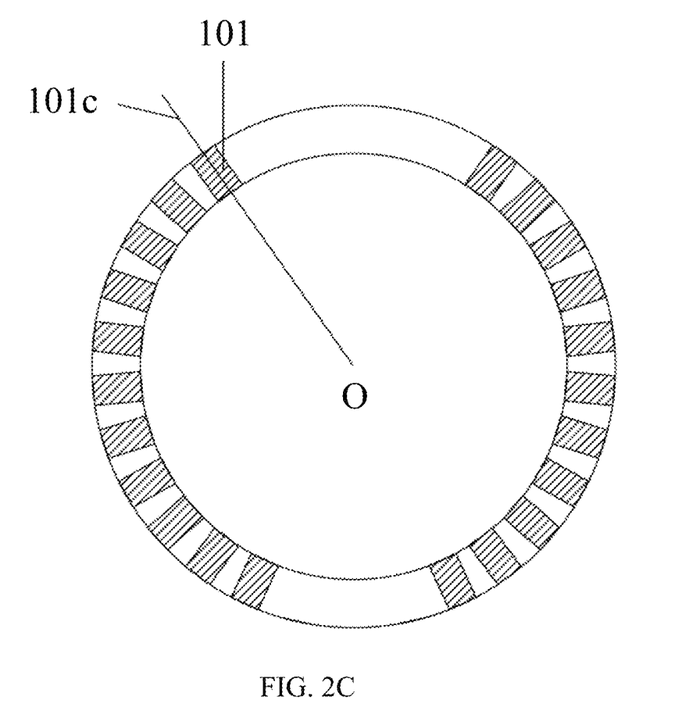
FIG. 2C illustrates a structural diagram of the magnet assembly shown in FIG. 1.

Specifically, the magnet assembly may include two arc-shaped sub-magnet groups (10, 11), and the two sub-magnet groups (10, 11) may be disposed inside the main chamber 1 and may symmetrically surround the base pedestal 2. Further, as shown in FIG. 2A, each sub-magnet group may include a plurality of magnetic cylinders 101 arranged along the circumferential direction of the base pedestal 2 to form an arc. The plurality of magnetic cylinders 101 may be arranged at intervals or may be arranged compactly. The directions of the magnetic poles of the magnetic cylinders 101 in the two sub-magnet groups may be the radial directions of the base pedestal 2. As shown in FIG. 2C, on a cross section of the base pedestal 2 along the direction perpendicular to the axis of the base pedestal 2 (i.e., the inner circle in FIG. 2C), the directions of the magnetic poles of the plurality of the magnetic cylinders 101 may be the radial directions of the base pedestal 2, that is, the axis 101$c$ of each the magnetic cylinder 101 may pass through the center point O of the cross section (i.e., the inner circle in FIG. 2C) of the base pedestal 2.

Further, the magnetic cylinders 101 may be all horizontally disposed, and the N pole of each magnetic cylinder 101 in one of the two sub-magnet groups may point to the base pedestal 2, while the S pole of each magnetic cylinder 101 in the other of the two sub-magnet groups may point to the base pedestal 2.

Figure 2D:
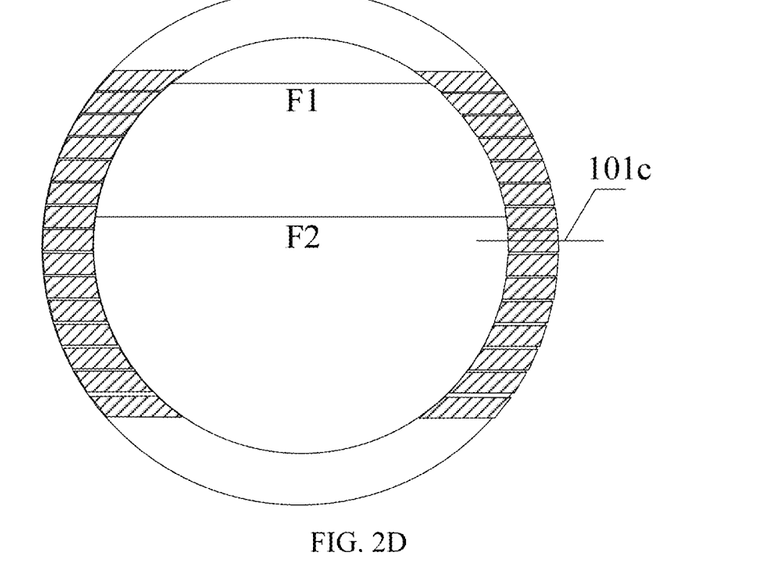
FIG. 2D illustrates a structural diagram of another magnet assembly.

Of course, in practical applications, as shown in FIG. 2D, in each sub-magnet group, the directions of the magnetic poles of the plurality of magnetic cylinders (i.e., the axes 101$c$ of the plurality of magnetic cylinders) may be parallel to each other, which can avoid or weaken the edge bending effect of the magnetic field lines generated by the magnet assembly, and thus ensure that a horizontal magnetic field is formed on the base pedestal 2. In this case, in each sub-magnet group, the projection shapes of the plurality of magnetic cylinders on the horizontal plane may be different. Specifically, the end faces of the magnetic poles of the plurality of magnetic cylinders in each sub-magnet group that point to a same direction may collectively form a smooth and continuous arc surface.

Figure 2E:
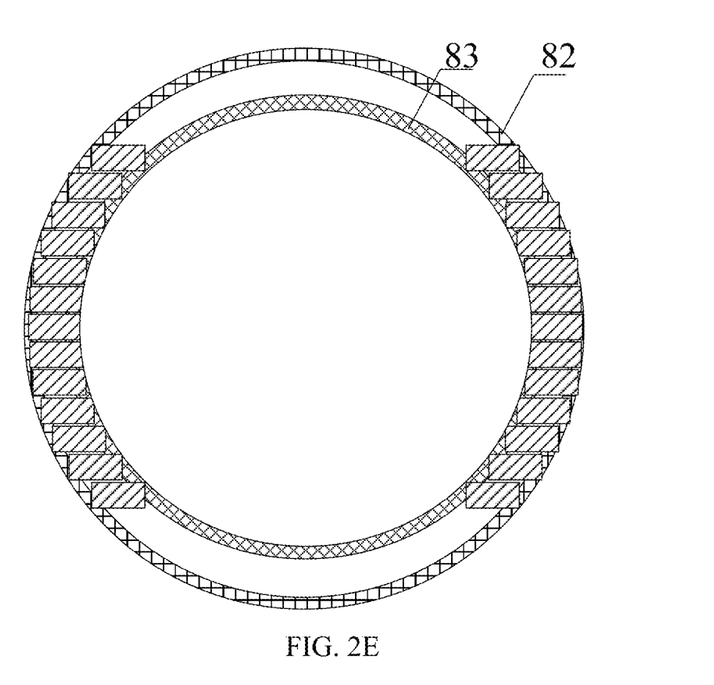
FIG. 2E illustrates a structural diagram of another magnet assembly.

Alternatively, as shown in FIG. 2E, in each sub-magnet group, the projection shapes of the plurality of magnetic cylinders may be the same, and the same end faces of the magnetic poles of the plurality of magnetic cylinders may collectively form a stepped arc surface.

Since each sub-magnet group is arranged in an arc shape along the outer circumference of the base pedestal 2, this can make the distance, between the N pole of any magnetic cylinder 101 pointing to the base pedestal 2 and the S pole of the magnetic cylinder 101 that receives the magnetic field lines emitted from the N pole, the shortest. The S pole of the magnetic cylinder 101 points to the base pedestal 2. Therefore, the number of magnetic field lines distributed in the vicinity of the base pedestal 2 may be increased, such that the magnetic field strength of the unidirectional horizontal magnetic field may be effectively increased to be sufficient to induce in-plane anisotropy of the magnetic thin film. Moreover, since the two sub-magnet groups (10, 11) are located on both sides of the base pedestal 2, this does not limit the size of the to-be-processed workpiece, and thus can be applied to large size to-be-processed workpieces (for example, an 8-inch or 12-inch wafer).

In addition, in practical applications, the number, the size and the distribution density of the magnetic cylinders (the spacing between two adjacent magnetic cylinders) can be freely set according to specific needs, and thus the flexibility of setting the magnetic field strength and the distribution density may be improved.

The magnetic field strength of the magnet assembly of the structure described above can reach 50 to 300 Gs. When the process is performed, the magnetic domains of the magnetic material deposited on the surface of the to-be-processed workpiece are aligned in the horizontal direction, such that an easy magnetization field may be obtained in the direction in which the magnetic domains are aligned, while a hard magnetization field may be obtained in the direction perpendicular to the direction in which the magnetic domains are aligned, that is, an in-plane anisotropy may be obtained. As such, a magnetic thin film with an in-plane anisotropy may be obtained, and thus the magnet assembly is suitable for preparing magnetic thin films having in-plane anisotropies on large size to-be-processed workpieces (for example, 8-inch or 12-inch wafers).

Taking FIG. 2D as an example, the distance F1 between the N pole of a magnetic cylinder 101 adjacent to the arc ends that points to the base pedestal 2 and the S pole of the magnetic cylinder 101 that receives the magnetic field lines emitted from the N pole is less than the distance F2 between the N pole of the magnetic cylinder 101 adjacent to the middle of the arc that points to base pedestal 2 and the S pole of the magnetic cylinder 101 that receives the magnetic field lines emitted from the N pole. Therefore, the strength of the magnetic field formed in the vicinity of both ends is greater than the strength of the magnetic field formed in the vicinity of the middle of the arc, that is, the magnetic field distribution is not uniform.

In order to solve the above problem, as shown in FIG. 2A, in the plurality of magnetic cylinders of each sub-magnet group, the distribution density of the magnetic cylinders in a portion that is adjacent to the two ends of the arc (or adjacent to the magnetic cylinder 101a at the end of the arc) may be made to be smaller than the distribution density of the magnetic cylinders in a portion that is adjacent to the middle of the arc (or adjacent to the magnetic cylinder 101b located in the middle of the arc). Further, the arc may be divided into an intermediate region and an edge region located on both sides of the intermediate region. The distribution density of the magnetic cylinders located in the edge region may be smaller than the distribution density of the magnetic cylinders located in the intermediate region. In this way, the strength of the magnetic field formed in the intermediate region may be compensated, and thus may be consistent with the strength of the magnetic field formed in the edge region. As such, the uniformity of the magnetic field may be improved.

It should be noted that in one embodiment, each magnetic cylinder may be horizontally disposed. However, the present disclosure is not limited to this. In practical applications, the magnetic cylinders may be vertically disposed, and the N pole of each magnetic cylinder in one of the two sub-magnet groups and the S pole of each magnetic cylinder in the other of the two sub-magnet groups may all be vertically upward to ensure that a horizontal magnetic field can be formed on the base pedestal 2. Moreover, the directions of the magnetic poles of the plurality of magnetic cylinders, i.e. the orthogonal projection of the axis of each magnetic cylinder on the radial section of the base pedestal 2 is point-like, and the connection between this point and the center point of the radial section of the base pedestal 2 may be along the radial direction of the base pedestal 2.

Alternatively, the magnetic cylinders may also be disposed obliquely, and the N pole of each magnetic cylinder in one of the two sub-magnet groups as well as the S pole of each magnetic pole in the other of the two sub-magnet groups may all obliquely point up along a direction toward the base pedestal 2 to ensure that a horizontal magnetic field can be formed on the base pedestal 2 while the magnetic field in the vicinity of the target 3 is not interfered. Moreover, the orthogonal projections of the directions of magnetic poles of the plurality of magnetic cylinders, i.e. the axes of the plurality of magnetic cylinders, on the radial section of the base pedestal 2 are straight lines, and the straight lines pass through the center point of the radial section of the base pedestal 2.

Optionally, in order to prevent the magnetic field lines from canceling each other and the strength of the magnetic field from being weakened, the magnetic poles of the plurality of magnetic cylinders in one of the two sub-magnet groups that vertically point downward or obliquely point downward may be magnetically conducted to the magnetic poles of the corresponding magnetic cylinders in the other of the two sub-magnet groups that vertically point downward or obliquely point downward. Specifically, a magnetic conductive component may be disposed in the main chamber 1 and around the base pedestal 2. The magnetic conductive component may be simultaneously connected with the magnetic poles of the magnetic cylinders in the two sub-magnet groups that vertically point downward or obliquely point downward to achieve magnetic conduction. In one embodiment, each sub-magnet group is located above the support component 41 and between the lower shielding ring 4 and the pressing ring 6. As such, the distance between each sub-magnet group and the base pedestal 2 may be minimized, and thus the magnetic field strength of the horizontal magnetic field may be increased to be sufficient to induce the in-plane anisotropy of the magnetic thin film.

In one embodiment, the bias magnetic field device may further include a support plate 81, an outer fixing plate 82, an inner fixing plate 83, and an upper cover 84. The support plate 81 may be used for supporting the magnet assembly and may be fixedly connected to the support component 41 through a plurality of support legs and screws 85 disposed at the bottom thereof. The outer fixing plate 82 and the inner fixing plate 83 may be disposed on the support plate 81 through screws 86, and may be respectively located inside and outside the sub-magnet group for fixing the magnetic poles (N poles and S poles) at the two ends of the sub-magnet group, respectively.

In addition, the outer fixing plate 82 and the inner fixing plate 83 may be made of a magnetic conductive material or may be made of a non-magnetic material. The upper cover 84 may be located above the sub-magnet group, and may be fixedly connected to the outer fixing plate 82 and the inner fixing plate 83, respectively through screws 87. The sub-magnet group may be located in a space enclosed by the support plate 81, the outer fixing plate 82, the inner fixing plate 83, and the upper cover 84. Since the support plate 81, the outer fixing plate 82 and the inner fixing plate 83 have a certain thermal insulation effect, this can prevent the heat in the main chamber from being directly transferred to the magnet assembly during the process, thereby preventing the magnetism of the magnet assembly from disappearing and the magnetic induction function from failing.

In one embodiment, both the support plate 81 and the outer fixing plate 82 have an arc shape and match the arc shape of the arc-shaped sub-magnet assembly. Also, the inner fixing plate 83 may have a closed ring shape to facilitate positioning between the two sub-magnet groups. Optionally, the inner fixing plate 83 may be made of a non-magnetic material, because when the inner fixing plate 83 is made of a magnetically permeable material, the closed ring structure may form closed magnetic field lines, thereby causing a decrease in the magnetic field strength.

Optionally, the upper cover 84 may have a closed ring shape, which may be able to cover the two sub-magnet groups and the gap in between, such that deposition of the sputtered target material on the sub-magnet groups or on the support component 41 through the gap between the two sub-magnet groups can be prevented.

Of course, in practical applications, the support plate 81 and the outer fixing plate 82 may also adopt a closed ring structure. The inner fixing plate 83 and the upper cover 84 may also have an arc-shaped structure, and may match the arc shape of the arc-shaped sub-magnet groups. The arc-shaped inner fixing plate 83 may be made of a magnetically permeable material or may be made of a non-magnetic material.

Figure 2F:
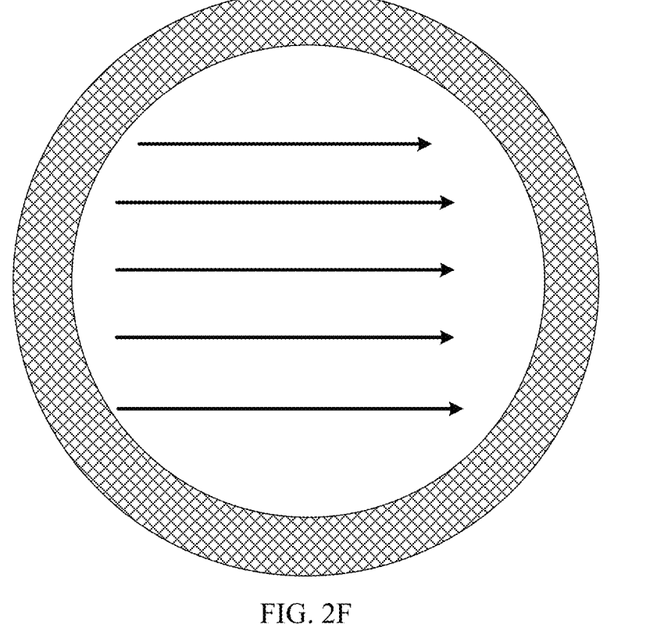
FIG. 2F illustrates a structural diagram of another magnet assembly.

It should be noted that, in one embodiment, the magnet assembly includes two sub-magnet groups (10, 11) in an arc shape, each sub-magnet group includes a plurality of magnetic cylinders, and the plurality of magnetic cylinders is spaced and distributed along the circumference of the base pedestal 2. However, the present disclosure is not limited to this, and in practical applications, a magnet assembly of any other configuration may be employed. For example, the magnet assembly may include two arc-shaped magnet segments. That is, the magnet may have a one-piece arc structure, and may have two arc-shaped magnet segments with the two arc-shaped magnet segments symmetrically disposed around the base pedestal. The N pole of one magnet segment and the S pole of the other magnet segment may both point to the base pedestal. In another example, as shown in FIG. 2F, the magnet assembly may include a closed ring magnet, and the ring magnet may form a horizontal magnetic field through integral magnetization of a permanent magnetic material.

Figure 3A:
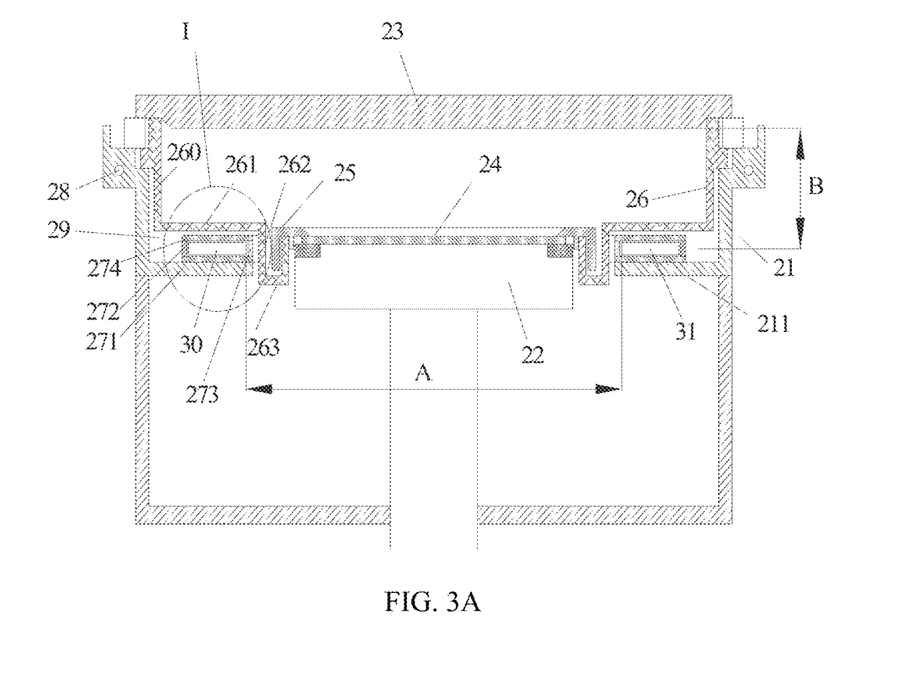
FIG. 3A illustrates a cross-sectional view of a magnetic thin film deposition chamber according to a second embodiment of the present disclosure.
Figure 3B:
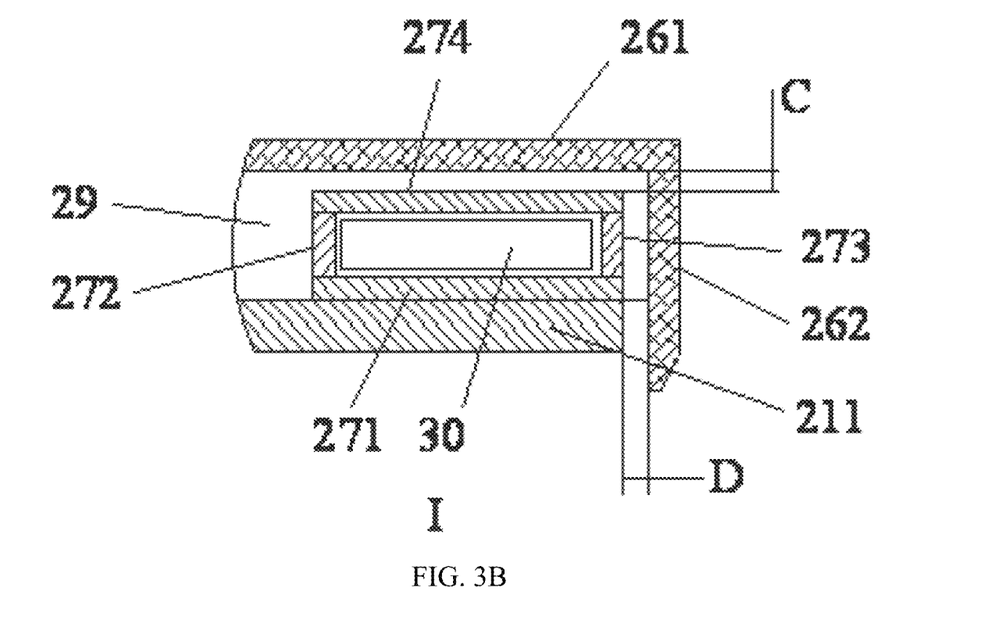
FIG. 3B illustrates an enlarged view of the region I in FIG. 3A.

FIG. 3A illustrates a cross-sectional view of a magnetic thin film deposition chamber provided by a second embodiment of the present disclosure. FIG. 3B shows an enlarged view of the area I in FIG. 3A. Referring to FIG. 3A and FIG. 3B together, the magnetic thin film deposition chamber may include a main chamber 21, a shielding assembly, and a bias magnetic field device. A target 23 may be disposed at the top portion of the main chamber 21, and a base pedestal 22 may be disposed in the main chamber 21 and below the target 23 for carrying a to-be-processed workpiece 24.

The bias magnetic field device may be configured for forming a horizontal magnetic field above the base pedestal 22, and the horizontal magnetic field may be used to provide an in-plane anisotropy to the magnetized film layer deposited on the to-be-processed workpiece 24. In one embodiment, the bias magnetic field device may include two arc-shaped sub-magnet groups (30, 31), and the two sub-magnet groups (30, 31) may be disposed in the main chamber 21 and may symmetrically surround the base pedestal 22. Further, similarly to the first embodiment described above, each sub-magnet group may include a plurality of magnetic cylinders arranged along the circumferential direction of the base pedestal 22 to form an arc. Each of the magnetic cylinders may be horizontally disposed, and the N poles of the plurality of magnetic cylinders in the sub-magnet group 30 and the S poles of the plurality of magnetic cylinders in the sub-magnet group 31 may all point to the base pedestal 22. The remaining structure and function of the magnet assembly are similar to those of the first embodiment described above, and will not be described again.

The magnetic field strength of the magnetic field generated by the magnet assembly of the structure described above can reach 50 to 300 Gs. When the process is performed, the magnetic domains of the magnetic material deposited on the surface of the to-be-processed workpiece are aligned in the horizontal direction, such that an easy magnetization field may be obtained in the direction in which the magnetic domains are aligned, while a hard magnetization field may be obtained in the direction perpendicular to the direction in which the magnetic domains are aligned. That is, an in-plane anisotropy may be formed. As such, a magnetic thin film with an in-plane anisotropy may be obtained, and thus the magnet assembly is applicable to large size to-be-processed workpieces (for example, 8-inch or 12-inch wafers).

The structure and function of the above two sub-magnet groups are similar to those of the first embodiment described above, and can also effectively increase the magnetic field strength of the horizontal magnetic field to be sufficient to induce the in-plane anisotropy of the magnetic thin film. Moreover, since the two sub-magnet groups (30, 31) are located on the two sides of the base pedestal 22, this does not limit the size of the to-be-processed workpiece, and thus can be applied to large size to-be-processed workpieces (for example, an 8-inch or 12-inch wafer).

Optionally, in order to realize that the magnetic field generated by the magnet assembly can cover the entire to-be-processed workpiece, the magnetic cylinders in the two sub-magnet groups may be arranged such that the distance A between the N pole of any magnetic cylinder pointing to the base pedestal 22 and the S pole of the magnetic cylinder that receives the magnetic field line emitted from the N pole may be larger than or equal to the diameter of the to-be-processed workpiece. The vertical distance B between the center line of each sub-magnet group and the surface of the target may be 84 mm.

The shielding assembly may be used to shield the bias magnetic field device, preventing the target material from being deposited on the bias magnetic field device. The shielding assembly may include a shielding element 26. Specifically, the shielding element 26 may include a first vertical portion 260, a horizontal portion 261, and a second vertical portion 262. The first vertical portion 260 may be disposed to surround the inner side of the sidewall of the main chamber 21, and may be used to prevent the sputtered target material deposition on the sidewall of the main chamber 21. The outer circumference of the horizontal portion 261 may be connected to the lower end of the first vertical portion 260, and the inner circumference of the horizontal portion 261 may be connected to the upper end of the second vertical portion 262. The horizontal portion 261 and the second vertical portion 262 may be located above and inside the bias magnetic field device, respectively.

The magnetic thin film deposition chamber may further include a support component 263 and a pressing ring 25. The support component 263 and the second vertical portion 262 of the shielding element 26 may be an integrated structure bent from the lower end of the second vertical portion 262 toward the inner side, and thus form a "hook" shape for supporting the pressing ring 25. The pressing ring 25 may be used to, when the base pedestal 22 is in the process position, press down the edge region of the upper surface of the to-be-processed workpiece 24, such that the to-be-processed workpiece 24 can be fixed on the base pedestal 22. When the base pedestal 22 is in the non-process position, the pressing ring 25 may be in contact with the support component 263 and may be supported by the support component 263; when the base pedestal 22 is in the process position, the pressing ring 25 may be lifted up by the raised base pedestal 22, may thus be disengaged from the support component 263. As such, with the help of the self-gravity of the pressing ring 25, the to-be-processed workpiece 24 may be fixed on the base pedestal 22. In one embodiment, the non-process position may be located below the process position.

When the process is performed, the shielding element 26, the support component 263, and the pressing ring 25 may cover the area between the base pedestal 22 and the sidewall of the main chamber 21, thereby preventing the sputtered target material deposition on the bottom and on the sidewalls of the main chamber 21.

Optionally, an annular boss 211 may be disposed on the inner side of the sidewall of the main chamber 21, and the annular boss 211 may be located below the horizontal portion 261 and on an outer side of the second vertical portion 262. As such, the annular boss 211, the horizontal portion 261, the second vertical portion 262, and the sidewall of the main chamber 21 may together form an annular space 29, and the bias magnetic field device may be located inside the annular space 29.

Compared with the first embodiment described above, the bias magnetic field device in the one embodiment is located below the shielding element 26. When the shielding element 26 needs to be cleaned, it is only necessary to remove the shielding element 26 without disassembling the bias magnetic field device. As such, the time for disassembly and assembly may be shortened and the work efficiency may be improved. Moreover, when the process is performed, the sputtering target material may not be deposited on the magnet assembly under the shielding effect of the shielding element 26.

In one embodiment, the bias magnetic field device may further include a support plate 271, an outer fixing plate 272, an inner fixing plate 273, and an upper cover 274. The support plate 271 may be used for supporting the sub-magnet group, and the support plate 271 may be disposed on the annular boss 211, and may be fixedly connected thereto. The outer fixing plate 272 and the inner fixing plate 273 may be disposed on the support plate 271 and may respectively located inside and outside the sub-magnet group for fixing the magnetic poles (N pole and S pole) at the two ends of the sub-magnet group, respectively. The outer fixing plate 272 and the inner fixing plate 273 may be made of a magnetically permeable material or may be made of a non-magnetic material. The upper cover 274 may be located above the sub-magnet group and may be fixedly connected to the outer fixing plate 272 and the inner fixing plate 273, respectively. The support plate 271, the outer fixing plate 272, the inner fixing plate 273, and the upper cover 274 may enclose a closed space, and the sub-magnet group may be located in the closed space. Since the support plate 271, the outer fixing plate 272, and the inner fixing plate 273 have a certain thermal insulation effect, this can prevent the heat in the main chamber 21 from being directly transferred to the magnet assembly during the process, thereby preventing the magnetism of the magnet assembly from disappearing, and the magnetic induction function from failing.

In practical applications, the support plate 271, the outer fixing plate 272, the inner fixing plate 273, and/or the upper cover 274 may have an arc shape or a closed ring shape; the arc shape of the support plate 271, the outer fixing plate 272, the inner fixing plate 273, and/or the upper cover 274 may match the arc shape of the sub-magnet group.

Optionally, the bias magnetic field device may be in contact with the upper surface of the annular boss 211. Since the annular boss 211 is connected to the sidewall of the main chamber 21, this may allow heat generated by the bias magnetic field device to be transferred through the annular boss 211 and the sidewall of the main chamber 21, thereby playing the role in cooling the bias magnetic field device. Specifically, the lower surface of the support plate 271 may be attached to the upper surface of the annular boss 211 to increase the contact area between the bias magnetic field device and the annular boss 211, thereby improving the cooling effect.

Further, optionally, a cooling channel 28 may be disposed on the inner side of the sidewall of the main chamber 21 along the circumferential direction. The cooling channel 28 may be used to introduce a cooling medium to cool the annular boss 211 and the support plate 271. As such, the heat of the bias magnetic field device may be taken away to prevent the magnet assembly from being demagnetized due to an excessive temperature. In practical applications, the cooling channel 28 may also be disposed in the annular boss 211 or in the sidewalls of the annular boss 211 and the main chamber 21.

Optionally, a horizontal gap D may be formed between the inner wall of the bias magnetic field device, i.e., the inner wall of the inner fixing plate 273 and the outer wall of the second vertical portion 262 to ensure that the heat of the shielding element 26 may not be transferred to the annular boss 211 and the sub-magnet groups, preventing the temperature of the sub-magnet groups from being too high. The horizontal gap D may be larger than or equal to 0.5 mm, e.g. 2 mm, and within the range, the thermal isolation effect may be optimal. Similarly, a vertical gap C may be formed between the upper surface of the bias magnetic field device and the lower surface of the horizontal portion 261 to ensure that the heat of the shielding element 26 may not be transferred to the sub-magnet groups. The vertical gap C may be less than or equal to 5 mm, e.g. 2 mm, and within the range, the thermal isolation effect may be optimal.

In summary, the magnetic thin film deposition chamber provided by the embodiments of the present disclosure is provided with a bias magnetic field device. The bias magnetic field device is configured for forming a horizontal magnetic field above the base pedestal. The horizontal magnetic field is used to provide an in-plane anisotropy to the magnetized film layer deposited on the to-be-processed workpiece, thereby satisfying the needs of production equipment for preparing magnetized film layers with in-plane anisotropies on large size to-be-processed workpieces.

As another technical solution, the present disclosure further provides a thin film deposition apparatus, including at least one first deposition chamber for depositing magnetized film layers. The first deposition chamber may employ the above magnetic thin film deposition chamber provided by the embodiments of the present disclosure.

The thin film deposition apparatus provided by the embodiments of the present disclosure is able to deposit magnetized film layers with in-plane anisotropies on the to-be-processed workpieces by using a magnetic thin film deposition chamber according to the embodiments of the present disclosure, which may be conducive to expanding the application frequency of magnetic thin films, and thus meet the needs of production equipment.

Optionally, the above thin film deposition apparatus may be further used for depositing a magnetic thin film stack. The magnetic thin film stack may include a magnetism-isolation unit, and the magnetism-isolation unit may include at least a pair of alternately disposed magnetized film layer and isolation layer. The thin film deposition apparatus may include at least one first deposition chamber for depositing the magnetized film layers, and at least one second deposition chamber for depositing the isolation layers. Optionally, the thin film deposition apparatus may further include a transfer chamber for transferring the to-be-processed workpiece between the first deposition chamber and the second deposition chamber.

Figure 4:
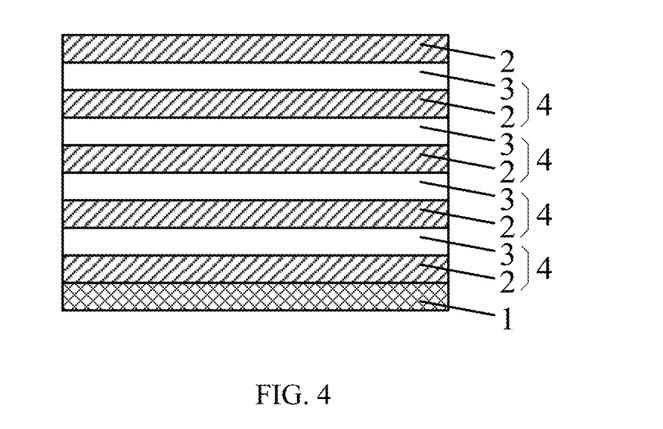
FIG. 4 illustrates a schematic structural diagram of a magnetic thin film stack obtained by using the thin film deposition apparatus provided by the embodiment of the present disclosure.

Specifically, FIG. 4 illustrates a schematic structural diagram of a magnetic thin film stack obtained by using the thin film deposition apparatus provided by the embodiment of the present disclosure. Referring to FIG. 4, the magnetic thin film stack may include a magnetism-isolation unit, and the magnetism-isolation unit may include a plurality of film-layer groups 4. The film-layer group 4 may include a magnetized film layer 2 and an isolation layer 3, and the magnetized film layers 2 and the isolation layers 3 of the plurality of film-layer groups 4 may be alternately disposed.

Specifically, in one embodiment, the isolation layer 3 in each film-layer group 4 may be disposed on the magnetized film layer 2, and thus the magnetized film layer 2 in the upper film-layer group 4 adjacent to the film-layer group 4 may be located on top of the isolation layer 3 in the film-layer group 4, i.e., the magnetized film layers 2 and the isolation layers 3 of the plurality of film-layer groups 4 may be alternately arranged.

In one embodiment, the magnetized film layers 2 and the isolation layers 3 in the above-mentioned magnetism-isolation unit may be disposed in pairs (each film-layer group is a pair). Further, a magnetized film layer 2 may be disposed on the isolation layer 3 of the uppermost film-layer group, that is, the total number of layers of the magnetized film layers 2 may be one more than the total number of layers of the isolation layers 3. Of course, in practical applications, a magnetized film layer 2 may not be further disposed on the isolation layer 3 of the uppermost film-layer group, and thus the total number of layers of the magnetized film layers 2 may be equal to the total number of layers of the isolation layers 3.

Optionally, the magnetic thin film stack may further include an adhesive layer 1, and the magnetized film layer 2 in the lowermost film-layer group 4 may be disposed on the adhesive layer 1. Through the above adhesive layer 1, the tensile stress of the magnetized film layer 2 may be adjusted, and thus the tensile stress of the magnetic thin film stack may be adjusted, thereby making it possible to obtain a magnetic thin film stack having a large total thickness. As such, the range of application frequency of inductor devices prepared therefrom may be broadened. In addition, due to the stress adjustment effect of the adhesive layer 1 on the magnetic thin film stack, the magnetic thin film stack can be applied to micro-inductive devices made of large size to-be-processed workpieces.

When the above adhesive layer 1 is provided, the thin film deposition apparatus may further include at least one third deposition chamber for depositing the adhesive layer 1 described above. Optionally, the thin film deposition apparatus may further include a transfer chamber for transferring the to-be-processed workpiece between the first deposition chamber, the second deposition chamber, and the third deposition chamber.

By adopting a magnetic thin film deposition chamber provided by various embodiments of the present disclosure, the thin film deposition apparatus provided by the embodiments of the present disclosure is able to generate a horizontal magnetic field above the base pedestal with a large magnetic field strength that is sufficient to induce in-plane anisotropy of the magnetic thin film. In addition, the thin film deposition apparatus does not limit the size of the to-be-processed workpiece, and thus can be applied to large size to-be-processed workpieces (for example, 8-inch or 12-inch wafers).

It should be understood that the embodiments described above are merely exemplary embodiments employed to explain the principles of the invention, but the present disclosure is not limited thereto. Various modifications and improvements can be made by those skilled in the art without departing from the spirit and scope of the present disclosure, and such modifications and improvements are also considered to be within the scope of the present disclosure.

What is claimed is:

1. A magnetic thin film deposition chamber, comprising:
a main chamber; and
a bias magnetic field device, wherein:
a base pedestal is disposed in the main chamber for carrying a to-be-processed workpiece,
the bias magnetic field device includes a magnet assembly that has two sub-magnet groups, wherein:
each of the two sub-magnet groups includes a plurality of magnetic cylinders arranged along a circumferential direction of the base pedestal,
the plurality of magnetic cylinders in the two sub-magnet groups form two discrete arcs, a central angle corresponding to each of the arcs being less than 180 degrees,
each of magnetization directions of the plurality of magnet cylinders passing a center point of the base pedestal, or, in one of the sub-magnet groups, all of the magnetization directions of the plurality of magnet cylinders are parallel,
the magnet assembly is configured for forming a horizontal magnetic field above the base pedestal, and
the horizontal magnetic field is configured to provide an in-plane anisotropy to a magnetized film layer deposited on the to-be-processed workpiece.

2. The magnetic thin film deposition chamber according to claim 1, wherein:
two sub-magnet groups are symmetrically disposed around the base pedestal.

3. The magnetic thin film deposition chamber according to claim 2, wherein:
the plurality of magnetic cylinders are disposed horizontally, and
an N pole of each magnetic cylinder in one of the two sub-magnet groups and an S pole of each magnetic cylinder in the other of the two sub-magnet groups point to the base pedestal.

4. The magnetic thin film deposition chamber according to claim 2, wherein:
the plurality of magnetic cylinders are disposed vertically, and
an N pole of each magnetic cylinder in one of the two sub-magnet groups and an S pole of each magnetic cylinder in the other of the two sub-magnet groups vertically point up.

5. The magnetic thin film deposition chamber according to claim 2, wherein:
the plurality of magnetic cylinders are disposed obliquely, and
an N pole of each magnetic cylinder in one of the two sub-magnet groups and an S pole of each magnetic cylinder in the other of the two sub-magnet groups obliquely point up along a direction toward the base pedestal.

6. The magnetic thin film deposition chamber according to claim 2, wherein:
in the plurality of magnetic cylinders of each sub-magnet group, a distribution density of the magnetic cylinders in a portion adjacent to two ends of the arc is smaller than a distribution density of the magnetic cylinders in a portion adjacent to a middle of the arc.

7. The magnetic thin film deposition chamber according to claim 2, wherein:
the magnetic cylinders in the two sub-magnet groups are arranged such that a distance between an N pole of any magnetic cylinder pointing to the base pedestal and an S pole, pointing to the base pedestal, of a magnetic cylinder that receives magnetic field lines emitted from the N pole is larger than or equal to a diameter of the to-be-processed workpiece.

8. The magnetic thin film deposition chamber according to claim 1, wherein the bias magnetic field device includes:
a support plate, configured to support the bias magnetic field device;

an inner fixing plate and an outer fixing plate, disposed on the support plate and respectively located inside and outside of the magnet assembly for fixing two ends of the bias magnetic field device, respectively;

an upper cover, located above the bias magnetic field device, and fixedly connected to the outer fixing plate and the inner fixing plate, respectively, wherein:
the bias magnetic field device is located in a space surrounded by the support plate, the outer fixing plate, the inner fixing plate, and the upper cover.

9. The magnetic thin film deposition chamber according to claim 1, wherein:
the magnetic thin film deposition chamber further includes a shielding assembly, wherein:
the shielding assembly is configured to shield the bias magnetic field device, preventing deposition of a target material on the bias magnetic field device, and
the shielding assembly includes a shielding element, the shielding element including a first vertical portion, a horizontal portion, and a second vertical portion, the first vertical portion disposed around an inner side of a sidewall of the main chamber, an outer circumference of the horizontal portion connected to a lower end of the first vertical portion, and an inner circumference of the horizontal portion connected to an upper end of the second vertical portion, wherein:
the horizontal portion and the second vertical portion are located above and inside the bias magnetic field device, respectively.

10. The magnetic thin film deposition chamber according to claim 9,
further including a support component and a pressing ring, wherein:
the pressing ring is configured to press down an edge region of an upper surface of the to-be-processed workpiece;
the support component is connected to a lower end of the second vertical portion, and is configured to support the pressing ring;
an annular boss is disposed on the inner side of the sidewall of the main chamber, and the annular boss is located below the horizontal portion and on an outer side of the second vertical portion;
the bias magnetic field device is located in an annular space formed by the sidewall of the main chamber, the annular boss, the horizontal portion, and the second vertical portion; and
the bias magnetic field device is in contact with an upper surface of the annular boss.

11. The magnetic thin film deposition chamber according to claim 10, wherein:
a cooling channel is disposed around the inner side of the sidewall of the main chamber and/or the annular boss along a circumferential direction, wherein the cooling channel is configured to introduce a cooling medium to cool the annular boss and the bias magnetic field device.

12. The magnetic thin film deposition chamber according to claim 10, wherein:
a horizontal gap is formed between an inner wall of the bias magnetic field device and an outer wall of the second vertical portion; and
the horizontal gap is larger than or equal to 0.5 mm.

13. The magnetic thin film deposition chamber according to claim 10, wherein:

a vertical gap is between an upper surface of the bias magnetic field device and a lower surface of the horizontal portion; and
the vertical gap is smaller than or equal to 5 mm.

14. A thin film deposition apparatus, comprising at least one first deposition chamber for depositing magnetized film layers, wherein:
each first deposition chamber of the at least one first deposition chamber includes:
a main chamber; and
a bias magnetic field device, wherein:
a base pedestal is disposed in the main chamber for carrying a to-be-processed workpiece,
the bias magnetic field device includes a magnet assembly that has two sub-magnet groups, wherein:
each of the two sub-magnet groups includes a plurality of magnetic cylinders arranged along a circumferential direction of the base pedestal,
the plurality of magnetic cylinders in the two sub-magnet groups form two discrete arcs, a central angle corresponding to each of the arcs being less than 180 degrees,
each of magnetization directions of the plurality of magnet cylinders passing a center point of the base pedestal, or, in one of the sub-magnet groups, all of the magnetization directions of the plurality of magnet cylinders are parallel,
the magnet assembly is configured for forming a horizontal magnetic field above the base pedestal, and
the horizontal magnetic field is configured to provide an in-plane anisotropy to a magnetized film layer deposited on the to-be-processed workpiece.

15. The thin film deposition apparatus according to claim 14, wherein:
the thin film deposition apparatus is configured to deposit a magnetic thin film stack, wherein:
the magnetic thin film stack includes a magnetism-isolation unit; the magnetism-isolation unit includes one or multiple film-layer groups; the film-layer groups include magnetized film layers and isolation layers; and the magnetized film layers and the isolation layers of multiple film-layer groups are alternately disposed, wherein the thin film deposition apparatus further includes:
at least one second deposition chamber for depositing the isolation layers; and
a first transfer chamber for transferring the to-be-processed workpiece between the at least one first deposition chamber and the at least one second deposition chamber.

16. The thin film deposition apparatus according to claim 15, wherein:
the magnetic thin film stack further includes an adhesive layer; and
the thin film deposition apparatus further includes:
at least one third deposition chamber for depositing the adhesive layer; and
a second transfer chamber for transferring the to-be-processed workpiece between the at least one first deposition chamber, the at least one second deposition chamber, and the at least one third deposition chamber.

17. A magnetic thin film deposition chamber, comprising:
a main chamber; and a bias magnetic field device, wherein:
- a base pedestal is disposed in the main chamber for carrying a to-be-processed workpiece,
- the bias magnetic field device includes a magnet assembly that has two sub-magnet groups, wherein:
  - each of the two sub-magnet groups includes a plurality of magnetic cylinders arranged along a circumferential direction of the base pedestal,
  - each of magnetization directions of the plurality of magnet cylinders passing a center point of the base pedestal, or, in one of the sub-magnet groups, all of the magnetization directions of the plurality of magnet cylinders are parallel,
  - the magnet assembly is configured for forming a horizontal magnetic field above the base pedestal, and
  - the horizontal magnetic field is configured to provide an in-plane anisotropy to a magnetized film layer deposited on the to-be-processed workpiece.

* * * * *